United States Patent [19]
Hayakawa et al.

[11] Patent Number: 5,603,618
[45] Date of Patent: Feb. 18, 1997

[54] MOUNTING BOARD UNIT ATTACHING/DETACHING DEVICE

[75] Inventors: Yasuyoshi Hayakawa, Yokohama; Naoki Asano; Tomio Noguchi, both of Kawasaki; Kazunori Takashima, Kamakura, all of Japan

[73] Assignee: Canon Kabushiki Kaisha, Tokyo, Japan

[21] Appl. No.: 265,136

[22] Filed: Jun. 24, 1994

[30] Foreign Application Priority Data

Jun. 25, 1993 [JP] Japan .................................. 5-155318

[51] Int. Cl.⁶ .................................................. H01R 9/09
[52] U.S. Cl. ............................ 439/64; 439/377; 361/756; 361/802
[58] Field of Search .............................. 439/64, 61, 377; 361/756, 802, 741, 801

[56] References Cited

U.S. PATENT DOCUMENTS

| | | | |
|---|---|---|---|
| 3,648,115 | 3/1972 | Teagno | 439/61 |
| 4,836,789 | 6/1989 | Rudy, Jr. et al. | 439/64 |
| 5,396,400 | 3/1995 | Register et al. | 439/377 |

OTHER PUBLICATIONS

IBM Technical Disclosure Bulletin, "Connector Actuation Mechanism", vol. 36, No. 08, Aug. 1993, pp. 481–482. 439/260.

*Primary Examiner*—Gary F. Paumen
*Attorney, Agent, or Firm*—Fitzpatrick, Cella, Harper & Scinto

[57] ABSTRACT

A device for attaching and detaching a mounting board unit with respect to a device body in a substantially vertical posture includes a controller base which has a detachable mounting board fixed thereto and a guide portion engaging a guide rail provided on the device body. The guide portion guides the controller base when the mounting board unit is attached to and detached from the device body. Mounting boards having different shapes can be mounted on the unit of the same construction, and even a mounting board on which a heavy device such as a hard disk is mounted can be easily attached to and detached from the device body in a vertically arranged condition.

11 Claims, 5 Drawing Sheets

MOUNTING BOARD UNIT ATTACHING/DETACHING DEVICE

BACKGROUND OF THE INVENTION

1. Field of the Invention

The present invention relates to a device for attaching/detaching a mounting board unit which includes a mounting board such as a controller board for a printer or the like.

2. Description of the Related Art

Recently, DTP (Desk Top Publishing) systems for outputting documents and figures prepared on personal computers or the like to printer devices, typically small-sized laser printers, have become more popular.

Such information transmission between printers and computers is performed in a predetermined format through transmission means such as a cable or optical communication.

The transmitted information is converted on the printer side into the format suitable for each printer used, to thereby produce a desired output. The conversion of information on the printer side is carried out by a controller board on which a CPU, a memory, etc. are mounted.

Such a controller board is not dependent solely on the specifications of a printer body, but is different depending on the type of OS of a personal computer used for communication, the type of a communication network, the capacity of a memory, and so on. Therefore, various types of controller boards are required in for different situations.

In view of the above, it is customary to provide extension slots in a controller board beforehand for enabling the controller board to be extended on the printer side, so that the user can extend the system configuration suitable for usage of a printer body after purchasing it.

Several extension methods for a controller board are as follows:

1. A large cover openable to attach/detach the controller board is provided on a printer body, allowing the user to open the cover and mount an additional board or memory when extending the system configuration; and 2. The controller board is guided by a guide member and, when extending the system configuration, the controller board slides out of the body for easier extension.

Of late, with more frequent needs of users to extend controller boards, the second method described above of sliding the controller board along the guide member to be attached to and detached from the body has primarily been employed because of providing more efficient extension.

On the other hand, the size of the printer body has been reduced year by year in consideration of the area required for installation, operability for users and lower cost that it is difficult to install a controller board horizontally as before. Therefore, it has been proposed to install a controller board vertically on, e.g., the back of the printer body.

However, the vertical arrangement of a controller board has the following disadvantages:

1. Because the board is guided along its upper and lower ends, a board shape must be determined in advance and the board shape once determined is hard to change;

2. With a recent increase in the amount of information to be handled, a large-capacity memory unit such as a hard disk is more often mounted directly on a controller board, with a resultant greater weight of the controller board. When such a controller board is vertically arranged in such a manner as to slide in the controller board, the board cannot support the weight of the hard disk and so on, resulting in possible warping of the board or pattern lands on the board may peel off; and 3. When the board is vertically inserted to the printer body, there is a risk that users may hurt their hands by part legs projecting from the back of the board.

SUMMARY OF THE INVENTION

With a view to solving the above problems, one object of the present invention is to easily attach and detach a mounting board unit to and from a device body.

Another object of the present invention is to enable a mounting board to be safely attached and detached.

In accordance with one aspect of the invention, a mounting board unit for attaching/detaching a mounting board to a device having a guide member includes a holding member for vertically holding the mounting board, an engagement portion for engaging the guide member provided on the device, with the engagement portion integrally formed with the holding member, and securing means for securing the mounting board to the holding member.

In accordance with another aspect of the invention, a mounting board unit attaching/detaching device comprises a device body having a receptacle, a first guide member provided in the receptacle, a first connector provided in the receptacle and secured to the device, and a mounting board unit slidably fitting in the receptacle. The mounting board unit comprises a mounting board and a holding member for holding the mounting board, with the holding member having an engagement portion for engaging the first guide member to vertically suspend the holding member therefrom and a bottom portion guided by the second guide member. In addition, a second connector is mounted on the mounting board and connected to the first connector.

These and other objects, aspects, features and advantages of the present invention will become apparent from the following detailed description of the preferred embodiments taken in conjunction with the drawings.

DESCRIPTION OF THE PREFERRED EMBODIMENTS

[Embodiment 1]

Figure 1:
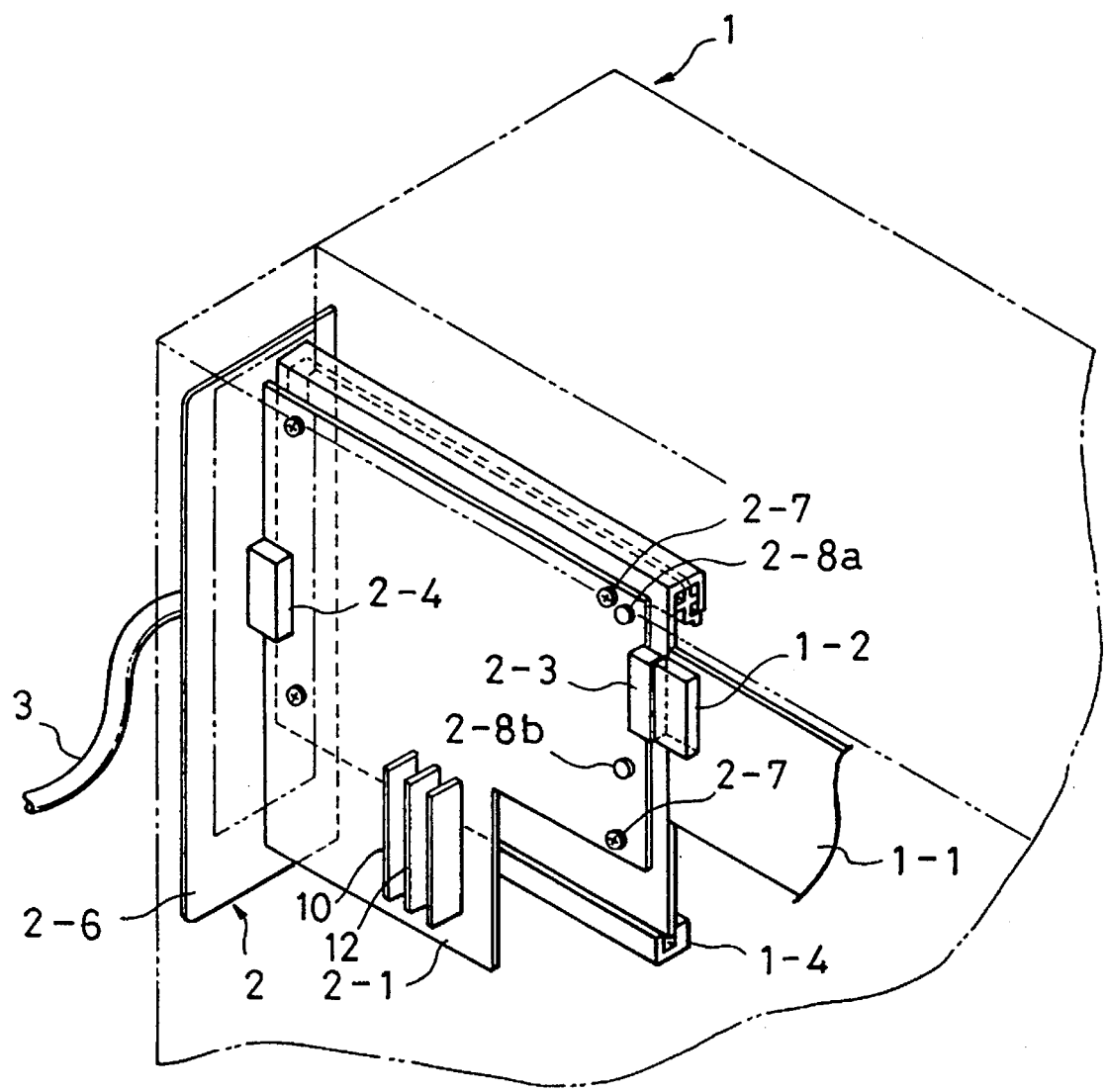
FIG. 1 is a perspective view showing the internal structure of a first embodiment of the present invention.
Figure 2:
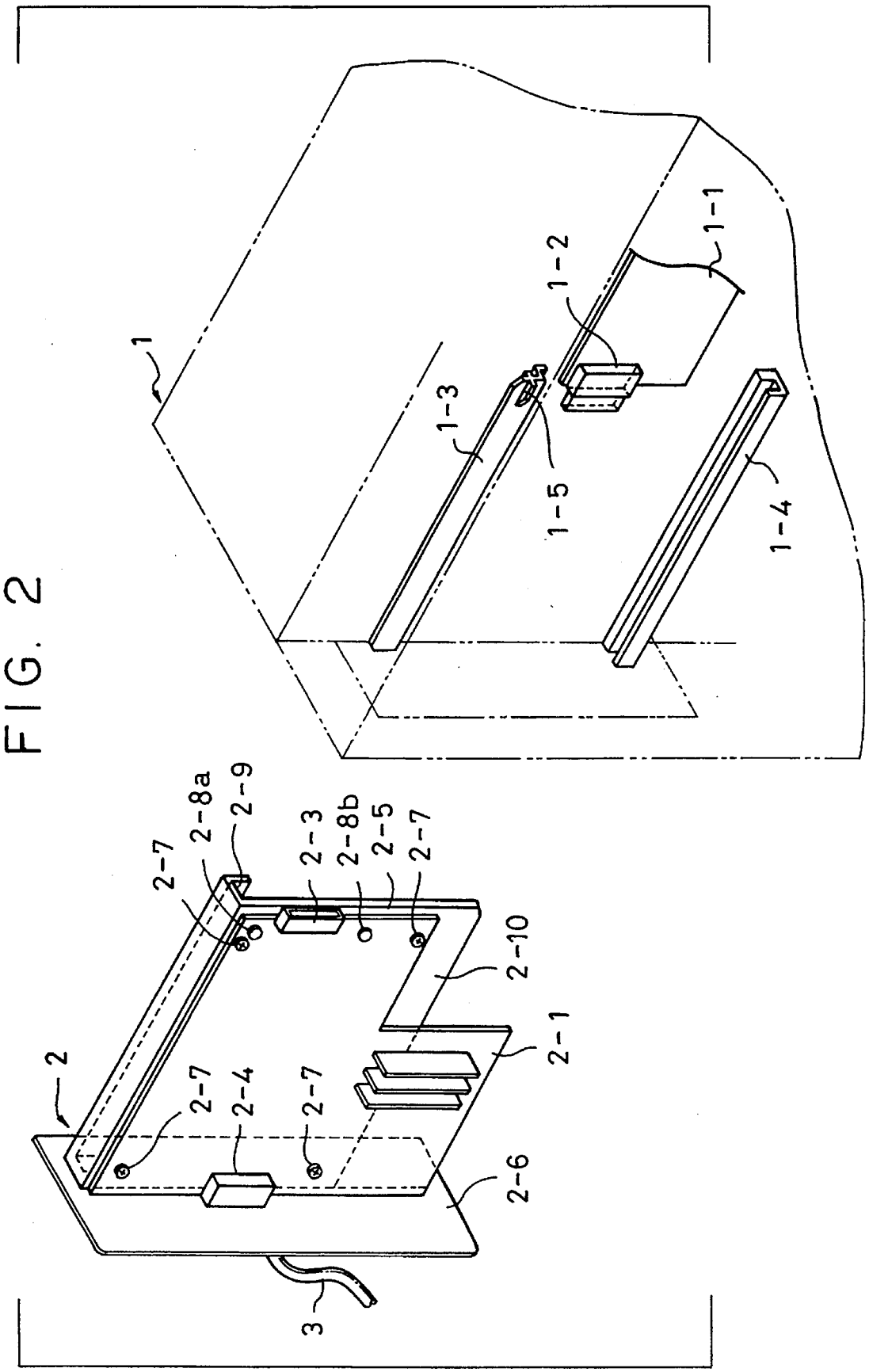
FIG. 2 is a perspective view showing the internal structure of a first embodiment of the present invention.
Figure 3:
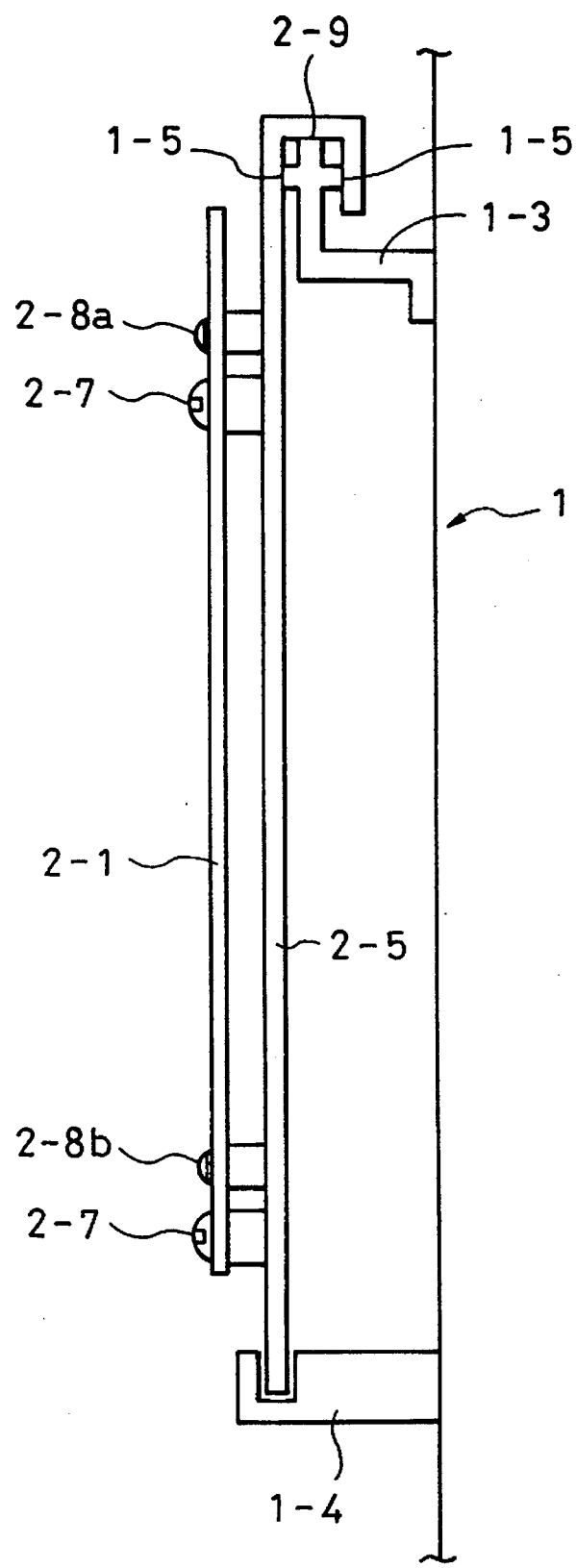
FIG. 3 is a cross-sectional view of the first embodiment of the present invention.

FIGS. 1, 2 and 3 show a first embodiment of the present invention in which the invention is applied to a mounting board as a controller board for a printer device.

FIG. 1 illustrates, particularly, a section of a mounting board unit 2 mounted on the printer device body 1. FIG. 2 illustrates the mounting board unit 2 detached from the printer device body 1.

The printer device body 1 includes paper feed means, image forming processing means, image fixing means, sheet discharging/loading means, etc. (not shown) which are required for the image forming.

The mounting board unit 2 transmits data via a cable 3 from a personal computer or the like to a controller board 2-1 as a mounting board through a connector 2-4. The controller board 2-1 serves as a print data control section on which a control circuit and a memory unit are mounted for converting the transmitted data into the format adapted for printing and storing the data for several sheets of prints.

The data converted into the predetermined format and stored in the mounting board unit 2 is transmitted from a connector 2-3 provided on the controller board 2-1 to a printer control board 1-1 attached to a printer body through a receiving connector 1-2. In accordance with the received data, a control circuit on the printer control board 1-1 controls the printer for producing a desired output.

Denoted by 2-6 is a panel serving as a cover when the mounting board unit 2 is mounted to the device body 1. The connector 2-4 is screwed or otherwise secured to the panel 2-6, and the controller base 2-5 is also screwed or otherwise connected to the panel 2-6.

An attaching/detaching mechanism for the mounting board unit 2 will now be described.

As for the mounting board unit 2, the controller board 2-1 mounting a connector for the cable 3, a CPU 10 for data control, a memory 12, etc. thereon is positioned with respect to a controller base, or holding member, 2-5 made of resin by positioning bosses 2-8*a*, 2-8*b* provided on the controller base 2-5, and then fixed to the controller base 2-5 by set screws 2-7 or other fixing means.

The controller base 2-5 is provided at its upper end with a guide portion 2-9 which has a channel-like shape with an inverted U-shaped cross section and has a channel groove wider than a rail 1-3 provided on the device body 1. By resting a front end of the guide portion 2-9 over the rail 1-3 on the device body and inserting it along the rail, the mounting board unit 2 can be mounted to the device body while being suspended from and vertically restricted by the rail 1-3.

At this time, a lower guide 1-4 provided on the device body has a groove slightly wider than the thickness of the controller base 2-5. The groove guides a lower portion of the controller base 2-5 on both sides near its lower edge 2-10 so that the mounting board unit 2 will not wobble.

With the continued insertion of the mounting board unit 2, immediately before the connector 2-3 on the controller base 2-5 is positioned with respect to the device body 1 and coupled to the connector 1-2 on the fixed printer control board 1-1, the controller base 2-5 bears against an engaging rib 1-5 provided on the rail 1-3 so as to eliminate any play in the direction of thickness and to position the mounting board unit 2 in place (see FIG. 3). As a result, the connectors are smoothly coupled to each other.

[Other embodiments]

Figure 4:
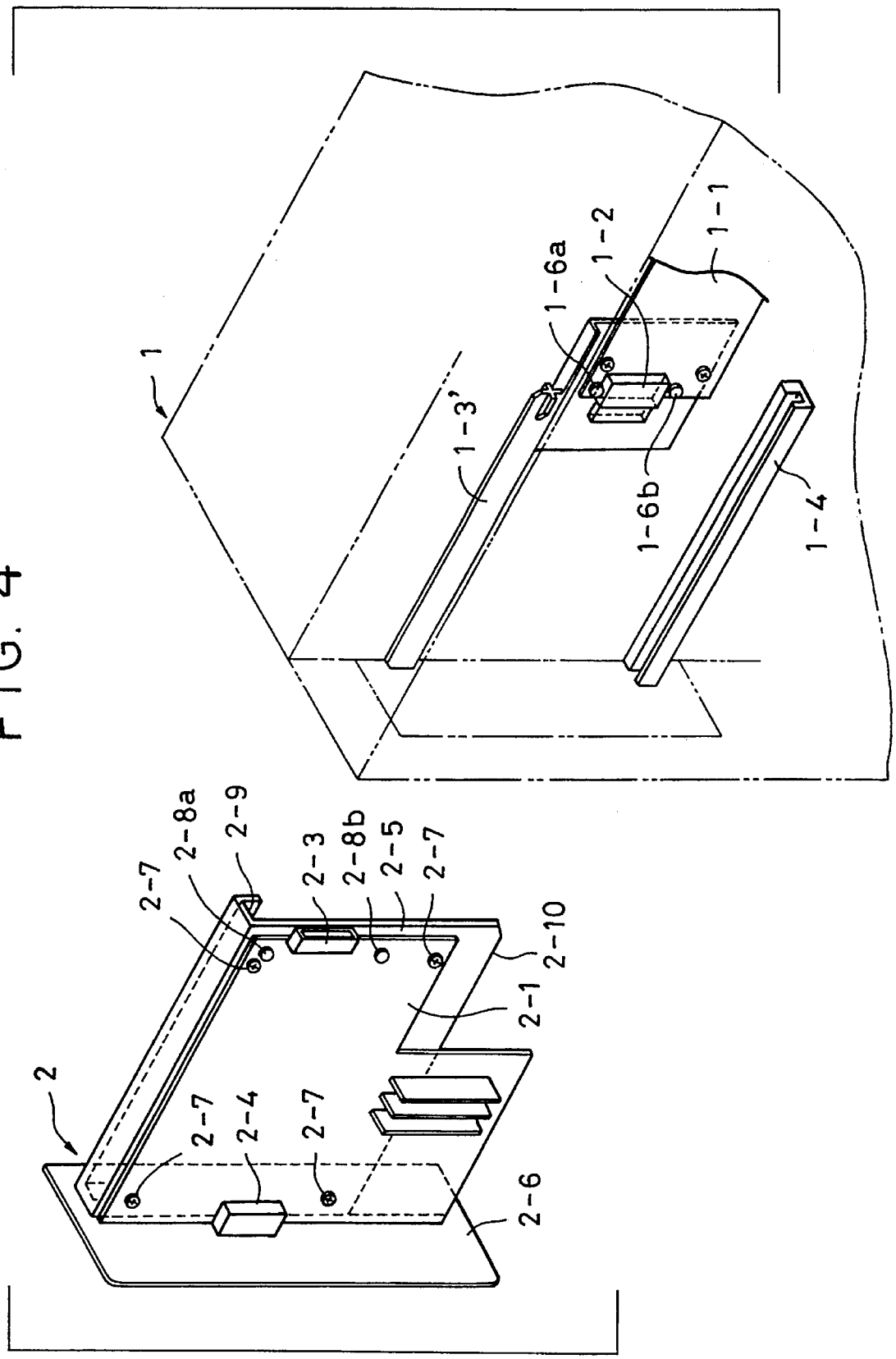
FIG. 4 is a perspective view showing the internal structure of a second embodiment of the present invention.
Figure 5:
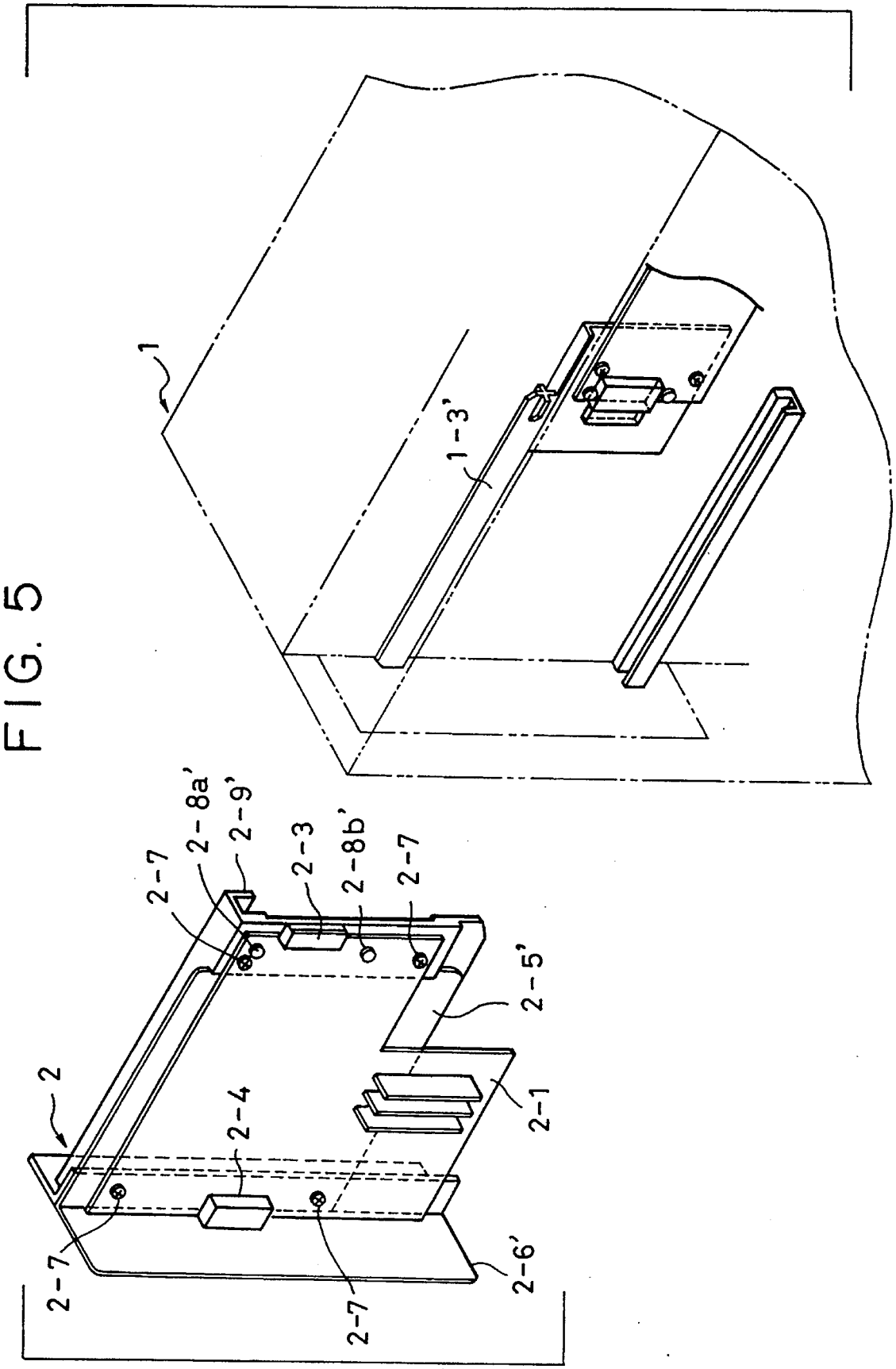
FIG. 5 is a perspective view showing the internal structure of a third embodiment of the present invention.

FIGS. 4 and 5 are perspective views of several other embodiments of the present invention.

[Embodiment 2]

FIG. 4 illustrates a second embodiment of the present invention.

The printer control board 1-1 attached to the device body 1 is fixed using positioning bosses 1-6*a*, 1-6*b* provided integrally with the rail 1-3. With this arrangement, the printer control board 1-1 is highly accurately positioned with respect to the rail 1-3.

[Embodiment 3]

FIG. 5 illustrates a third embodiment of the present invention. The controller base 2-5' in the third embodiment shown is formed of sheet metal integrally formed with the panel 2-6'. Then, positioning bosses 2-8*a'*, 2-8*b'* for the controller board 2-1 and a guide 2-9' integrally resin-molded in one-piece are fixed to the controller base 2-5'.

The controller base 2-5' is fixed between the guide 2-9' and the controller board 2-1. Screws 2-7 on the right-hand side of the controller board as shown in FIG. 5 secure the controller board and the guide together, while screws 2-7 on the left-hand side of the controller pass through the controller board 2-1, the controller base 2-5' and the guide 2-9'. These components can be secured to the panel 2-6' in the same manner discussed above with respect to the first embodiment.

With such an arrangement, the controller base 2-5' can double as a highly efficient shield plate.

Also, since the resin-molded guide 2-9' covers an edge of the controller base 2-5' being in the form of a sheet metal and doubling as a shield, users are kept from touching the edge of the sheet metal and hence protected from hurting their fingers upon attachment/detachment.

According to the present invention, as described hereinabove, in a device for attaching and detaching a mounting board unit with respect to a device body in a substantially vertical posture, the device includes a controller (board attachment) base which has a detachable mounting board fixed thereto and a guide portion engaging a guide rail provided on the device body to guide the controller base when the mounting board unit is attached to and detached from the device body. By setting attachment holes and positioning holes in the mounting board in common, the mounting board unit can be easily attached to and detached from the device body. This allows for mounting boards having different shapes and heavy mounting boards with hard disks or the like thereon to be arranged vertically.

Accordingly, in the mounting board unit which can be attached and detached from the device body in a substantially vertical condition, it is possible to prepare a plurality of mounting board beforehand and to select the cheapest mounting board in conformity with specifications required, for providing it to users. Further, since any excessive load is exerted on the mounting board and the users are kept from accidentally touching the back of the mounting board, the possibility that the users may damage the board or hurt their fingers upon attachment/detaching is eliminated.

With the mounting board unit guided in a suspended manner, when users attach and detach the mounting board unit, the guide member bearing the weight of the mounting board unit is not concealed by the mounting board, thereby giving the users a clearer view of the guide groove and preventing erroneous insertion of the mounting board unit.

In addition, since the mounting board unit is positioned and fixed with the aid of the guide member when attached in place, the connector position can be stably maintained with high accuracy even in mass production. Therefore, the load required upon attachment/detachment of the connector can be kept at constant.

Incidentally, while the above embodiment has been described in connection with the controller board for a printer, the present invention can also be practiced in a like manner when applied to other types of mounting boards.

Although specific embodiments of the present invention have been described above in detail, it will be understood that this description is merely for purposes of illustration. Various modifications of and equivalent structures corresponding to the disclosed aspects of the preferred embodiments in addition to those described above may be made by those skilled in the art without departing from the spirit of the present invention which is defined in the following claims, the scope of which is to be accorded the broadest interpretation so as to encompass such modifications and equivalent structures.

What is claimed is:

1. A mounting board unit for vertically attaching/detaching a mounting board within a device having a guide rail and a guide member, said unit comprising:

a holding member for vertically holding the mounting board;

an engagement portion having an inverted U-shaped cross-section for engaging the guide rail provided on the device, said engagement portion integrally formed with said holding member and suspending said holding member from the guide rail; and securing means for securing the mounting board to said holding member.

2. A mounting board unit according to claim 1, further comprising a panel portion abutting one end of said holding member and covering a receptacle of the device.

3. A mounting board unit according to claim 2, further comprising fixing means for fixing said panel portion to said holding member.

4. A mounting board unit according to claim 2, wherein said panel portion is integrally formed with said holding body.

5. A mounting board device for vertically attaching/detaching a mounting board, comprising:

a device body having a receptacle with an upper and lower part;

a first guide member provided on the upper part in the receptacle, with said first guide member being a guide rail;

a second guide member provided on the lower part in the receptacle;

a first connector provided in the receptacle and secured to said device body;

a mounting board unit slidably fitting in the receptacle, said mounting board unit comprising a mounting board and a holding member for holding said mounting board, with said holding member having an engagement portion for engaging said first guide member to vertically suspend said holding member therefrom and a bottom portion guided by said second guide member, said engagement portion having an inverted U-shaped cross-section for engaging said first guide member; and a second connector mounted on said mounting board to be connected to said first connector.

6. A mounting board device according to claim 5, further comprising a panel portion abutting one end of said holding member and serving to cover the receptacle of the device.

7. A mounting board device according to claim 6, further comprising fixing means for fixing said panel portion to said holding member.

8. A mounting board device according to claim 6, wherein said panel portion is integrally formed to said holding body.

9. A mounting board device according to claim 5, wherein said first guide member has a rib for eliminating any play between said engagement portion in a transverse direction.

10. A mounting board device according to claim 5, wherein said device body includes a controller board on which said first connector is provided.

11. A mounting board device according to claim 5, further comprising a third connector mounted on said mounting board to be connected to an external device.

* * * * *